United States Patent [19]

Vertongen et al.

[11] Patent Number: 4,736,273

[45] Date of Patent: Apr. 5, 1988

[54] POWER SEMICONDUCTOR DEVICE FOR SURFACE MOUNTING

[75] Inventors: Bernard M. G. Vertongen, Caen, France; André M. Papoular, Eindhoven, Netherlands

[73] Assignee: U.S. Philips Corporation, New York, N.Y.

[21] Appl. No.: 911,590

[22] Filed: Sep. 25, 1986

[30] Foreign Application Priority Data

Jan. 10, 1985 [FR] France ................................ 85 14537

[51] Int. Cl.[4] ............................................. H05K 7/20
[52] U.S. Cl. ................................. 361/386; 174/16 HS; 357/81
[58] Field of Search ............... 361/386, 387, 388, 383; 174/16 HS; 357/81

[56] References Cited

U.S. PATENT DOCUMENTS

| | | | |
|---|---|---|---|
| 3,423,516 | 1/1969 | Segerson | 174/16 HS |
| 3,597,666 | 9/1971 | Taskovich | 357/81 X |
| 4,012,765 | 3/1977 | Lehner et al. | 357/81 X |
| 4,215,361 | 7/1980 | McCarthy | 357/81 |
| 4,270,138 | 5/1981 | Desmond | 774/16 HS |
| 4,339,768 | 7/1982 | Keller et al. | 357/81 X |
| 4,344,106 | 8/1982 | West et al. | 361/386 |
| 4,460,917 | 7/1984 | Rogers | 357/81 |
| 4,649,460 | 3/1987 | Marchisi et al. | 357/81 X |

OTHER PUBLICATIONS

IBM TDB "Surface Mounted Power Transistor and Heatsink", vol. 28, No. 12, May 1986.

Primary Examiner—J. R. Scott
Assistant Examiner—A. Jonathan Wysocki
Attorney, Agent, or Firm—Jack Oisher; Steven R. Biren

[57] ABSTRACT

A power semiconductor device for surface mounting includes an isolating body, a thermal dissipator and electrical connection pins. The pins and legs of the thermal dissipator extend in the direction of the lower surface of the body. During a surface mounting operation of the device on a substrate, a quantity of solder is enclosed by a capillary effect under the major part of the plate. Thus, a good electrical and thermal contact is obtained with a metallization of the substrate.

5 Claims, 1 Drawing Sheet

POWER SEMICONDUCTOR DEVICE FOR SURFACE MOUNTING

The present invention relates to a power semiconductor device having at least one semiconductor wafer enveloped by a body of isolating material and in thermal and electrical contact with a central metal layer, which is prolonged by a heat-dissipating metal plate extending longitudinally from a first lateral surface of the body and having cuts forming legs, a second lateral surface of the said body opposite to the first surface having conducting pins extending longitudinally.

Such devices are widely used, for example in the form of components accommodated in a JEDEC TO-220 housing and are suitable for a conventional mounting technique, that is to say that the pins traverse holes of a printed circuit and are soldered at their free ends.

The actual development of the techniques leads increasingly to giving preference to surface mounting, more particularly by wafer soldering.

Some power components are excluded from surface mounting, which causes the hybrid microcircuits to be mounted in part by a different technology.

Due to the specific character of the surface mounting technique, those skilled in the art tend to believe that a device for surface mounting can be obtained only by starting from already-known devices for surface mounting.

SUMMARY OF THE INVENTION

To the contrary, the invention has for its object to solve the problem by adapting the aforementioned devices to the surface mounting technique, more particularly by wave soldering, while modifying their structures to the smallest possible extent, but modifying the function of these structures in such a manner that the housings that can be used for conventional mounting and surface mounting can be manufactured according to the same technique and with the same tools.

On the other hand, the device according to the invention is designed in such a manner that it affords high thermal dissipation.

Tha basic idea of the invention is that the dissipating plate is soldered over the major part of its surface in order to obtain an electrical and a thermal coupling with a metalization of a substrate by means of a thin soldering layer due to a capillary effect.

The power semiconductor device according to the invention is for this purpose characterized in that the pins and the legs are bent in the direction of a so-called lower surface of the said body in such a manner that they project beyond it and beyond a lower surface of the dissipating plate, the distance over which the legs project beyond the latter being such that during a surface mounting operation of the device by wave soldering on a substrate, a quantity of solder is enclosed by a capillary effect under the plate in such a manner that this quantity of solder is in electrical and thermal contact over the major part of the surface of the plate with a metallization of the said substrate.

The distance over which the end of the legs projects beyond the lower surface of the dissipating plate preferably lies between 0.1 and 0.2 mm.

According to a preferred embodiment, the surface of the plate comprises a lower surface substantially coplanar with the lower surface of the body.

As the dissipating plate is soldered on a metallization of the substrate, it can be used as the electrical output, the pins constituting other electrical outputs not being in contact with the plate.

BRIEF DESCRIPTION OF THE DRAWING

The invention will be more clearly understood with reference to the drawing, in which:

FIG. 3a shows a power semiconductor device according to the preferred embodiment of the invention obtained from the cut tape shown in FIG. 1a;

DESCRIPTION OF THE PREFERRED EMBODIMENT

Figure 1A:
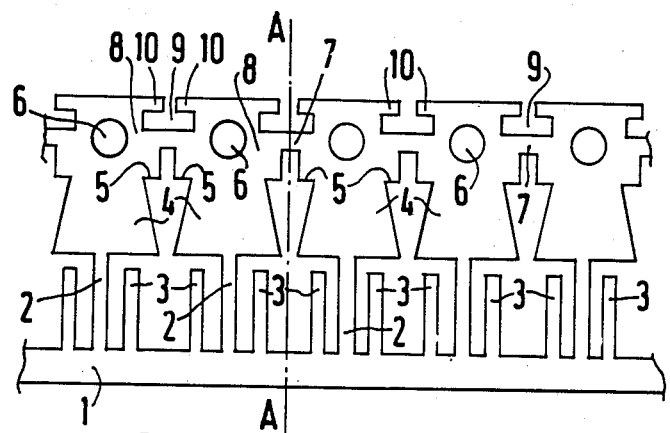
FIG. 1a is a front elevation of a precut tape according to the prior art.

As shown in FIG. 1a, a precut conductive tape of a type known for making standard JEDEC TO-220 housings comprises identical patterns longitudinally repeated and each comprising a central surface 4, on which a power semiconductor wafer will be soldered. This central surface 4, of generally trapezoidal form, is prolonged beyond a recessed part 5 by a dissipating plate 8 provided with a central hole 6 used for mechanical fixation purposes. The central surface 4 has at its end opposite to the dissipating plate 8 a central pin 2. The ends of the pins 2 opposite to the central surface 4 are mechanically joined together by a longitudinal tape 1 carrying pairs of lateral pins 3 each enclosing central legs 2 and being shorter than the latter. The dissipating plates 8 are further interconnected by tongues 7. The tongues 7 and pins 10 prolonging the end of the plates 8 are limited by a cut 9 in the form of an inverted T. The precut tape is obtained from a laminated tape of double thickness, which permits obtaining a smaller thickness for the pins 2 and 3 and the longitudinal tape 1.

Figure 1B:
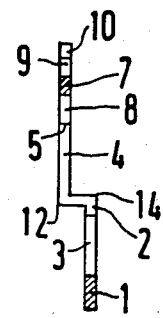
FIG. 1b is a sectional view AA of such a tape after bending the legs according to the prior art.
Figure 2:
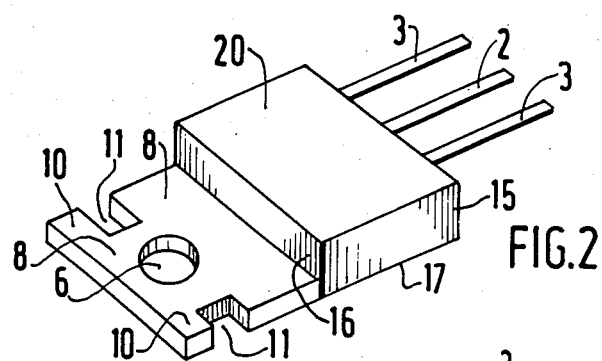
FIG. 2 shows a power semiconductor device enveloped according to the prior art manufactured from the tape shown in FIGS. 1a and 1b.

The enclosed device is formed in the following manner from the precut tape shown in FIG. 1a:

bending the pins 2 at 90° in a direction indicated by 12 and at 90° in the other direction indicated by 14 in such a manner that their plane and that of the pins 3 are shifted with respect to that of the central surface 4 (cf. FIG. 1b).

soldering power semiconductor wafers on the central surfaces 4, i.e. in electrical and thermal contact with the latter, and soldering the connection wires between each wafer and the lateral legs 3;

enveloping entirely in as isolating manner the central surfaces 4 with their semiconductor wafers and the connection wires by causing the ends of the pins 2 and 3 and the dissipating plate 8 to project.

cutting the individual components while eliminating the tongues 7 and the tape 1 in such a manner that the device shown in FIG. 2 is obtained.

Consequently, this device comprises an isolating enveloping body 20, of which a lateral surface 15 has a central pin 2 and two lateral pins 3 and of which the lateral opposite surface 16 has a dissipating plate 8 provided with cuts 11 and limiting legs 10.

Such device is used for a mounting of the conventional type on a printed circuit.

The invention has for its object to adapt this device to surface mounting with a minimum number of modifications, as a result of which the starting material can be the same precut tape (cf. FIG. 1a) as used according to the prior art.

Figure 3B:
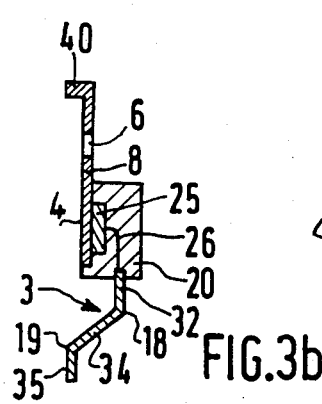
FIG. 3b is a longitudinal sectional view of the device shown in FIG. 3a in a plane laterally shifted in such a manner that the subsisting pins appear, without the remaining part of the cut central pin appearing.
Figure 3A:
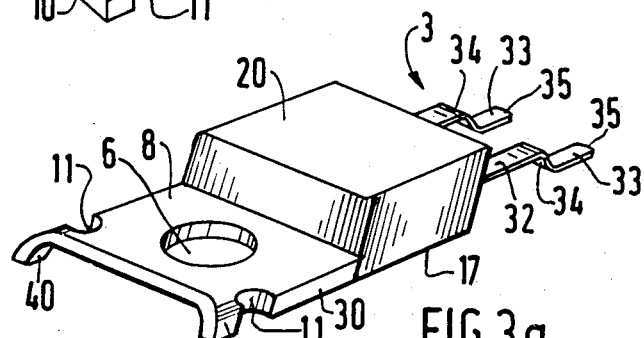

According to FIGS. 3a and 3b, the device according to the invention permits obtaining a particularly advantageous adaption to surface mounting by the introduction of a supplementary bending step, preferably after the steps of developing and cutting the individual devices, i.e. by starting from the pre-existent component of FIG. 2 in a standard JEDEC TO-220 housing and by using a standard equipment.

The basic idea of the invention is that the legs 10 are utilized, which according to the prior art only had the function of providing access to the tongues 7 during the step of cutting them.

The legs 10 (now denoted by reference numeral 40) are bent in such a manner that they project from the lower surface 17 of the isolating body 20. They project from the dissipating plate 8 over a distance permitting during a wave soldering operation described hereinafter the accumulation by a capillary effect of a quantity of solder 43 under the major part of the dissipating plate 8. Due to the fact that this accumulation is obtained by a capillary effect on a surface just larger than that of a drop of solder, the solder 43 forms a thin layer. Moreover, the pins 2 and 3 are subjected to two supplementary folding operations in opposite sense at 18 and 19 each at an angle that may be of the order of 45°, in such a manner thay they project from the lower surface 17 of the body 20 so that they are located in the same plane as the end of the legs 40. The legs 3 have an end 35 to be soldered, a flat part 34 between the folded areas 18 and 19 and an end 32 which is partly enveloped.

The bending operation is therefore preferably effected starting from a component of the kind shown in FIG. 2. A standard machine holds the pins as close as possible to the housing 20 (at a distance of about 1 mm). The pins can then be bent at a distance of about 5 to 6 mm from the housing 20. Since the electrical contact of the pins 2 is formed at the level of the plates 8, it is no longer necessary to maintain these pins except if an electrical output of all the contacts on the same side of the housing is required. A cutting operation is then carried out simultaneously with the bending operation and also with a standard material in such manner that the pin 2 is eliminated and this pin is cut as close to the body 20 as possible. Thus, the preferred embodiment shown in FIGS. 3a and 3b is obtained. The dissipating plate 8 in electrical and thermal contact with a semiconductor wafer 20 constitutes an electrical output and the pins 3 constitute other electrical outputs not in electrical contact with the latter. The pins 3 are connected by wires 26 to electrical contacts of the wafer 20 soldered on the plate 8.

Figure 4:
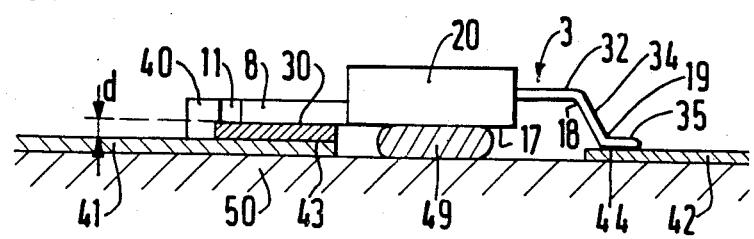
FIG. 4 is a lateral sectional view of the mounting of the device shown in FIG. 3a by wave soldering.

According to FIG. 4, the body 20 is fixed at the level of the part 4 by means of glue 49 capable of withstanding the temperature at the surface of a substrate 50 of, for example, a printed circuit carrying metallizations 41 and 42. This provisional fixation by the glue 49 permits, in known manner, holding the device in place during a subsequent wave soldering operation, for which the circuit is inverted. During this operation, the ends 35 of the legs 3 are soldered to a metallization 42 and the dissipating plate 8 is soldered to a metallization 41, which extends opposite to the plate 8 and beyond the latter.

The distance d over which the end of the legs 40 projects with respect to the lower surface 30 of the dissipating plate 8 is chosen, as stated above, in such a manner that a thin layer of solder 43 is enclosed during the wave soldering operation by a capillary effect under the major part of the said plate, which is substantially parallel to the plane of the metallization 41. This permits obtaining a good electrical contact and a good thermal contact between the plate 8 and the metallization 41 due to the fact that the soldering thickness is small. The evacuation of the calories thus facilitated will be better as the solder 43 will extend over a larger surface area. In fact, the thin layer of air between the device and the substrate 50 has a thermally isolating effect. By way of example, a distance of projection d of 0.1 to 0.2 mm is susceptible to yielding the best results as to the envisaged capillary and thermal properties.

However, it should be noted that during the wave soldering operation, the small volume of air present between the plate 8 and the metallization 41 has to be evacuated in order that space is left for the solder 43. The presence of the central hole 6 strongly promotes the formation of the drop of solder 43 due to the fact that it provides a supplementary way of access to the lower surface 30 of the plate 8.

It is possible to use as a variation a precut tape not provided with holes 6, but this involves the risk of a poor distribution of the solder 43, because air can remain enclosed between the plate 8 and the metallization 41.

This variation moreover would require the use of a precut tape slightly different from that according to the prior art.

What is claimed is:

1. A power semiconductor device, which comprises:
   at least one semiconductor wafer;
   a metal mounting plate having a central portion, said semiconductor wafer being mounted in thermal and electrical contact with said central portion;
   a body of isolating material on said central portion and enveloping said wafer;
   a heat-dissipating portion of said metal plate alongside said central portion and extending laterally from a first side of said body;
   conducting pins extending longitudinally from a second, opposite side of said body and extending downwardly to a level below that of said metal plate;
   legs formed from parts of said heat-dissipating portion and extending perpendicularly downward below said metal plate in a direction away from said body, said legs and said pins projecting substantially the same distance below said metal plate; and
   said legs extending a distance below the lower surface of said metal plate such that, during a surface mounting operation of the device by wave soldering on a substrate, a quantity of solder is enclosed by a capillary effect under the heat-dissipating portion of said metal plate, covers a major part of the lower surface of said heat-dissipating portion and is in electrical and thermal contact with a metallized portion of said substrate.

2. A device as claimed in claim 1, characterized in that the distance which said legs extend below the lower surface of the heat-dissipating portion of the metal plate is between about 0.1 and 0.2 mm.

3. A device as claimed in claim 1 or 2, characterized in that the heat-dissipating portion of the metal plate has a central hole to facilitate the formation of the quantity of the solder during the wave soldering operation.

4. A device as claimed in claim 1 or 2, characterized in that the lower surface of the metal plate is substantially coplanar with the lower surface of the body.

5. A device as claimed in claim 1 or 2, characterized in that the heat-dissipating portion of the metal plate comprises an electrical output terminal and in that the pins comprise other electrical outputs not in contact with the metal plate.

* * * * *

UNITED STATES PATENT AND TRADEMARK OFFICE
CERTIFICATE OF CORRECTION

PATENT NO. : 4,736,273

DATED : April 5, 1988

INVENTOR(S) : Bernard M.G. Vertongen et al

It is certified that error appears in the above-identified patent and that said Letters Patent is hereby corrected as shown below:

On the Title Page, Item [30], change
Foreign Application Priority Date
from "January 10, 1985" to --October 1, 1985--

Signed and Sealed this

Twenty-ninth Day of November, 1988

Attest:

DONALD J. QUIGG

Attesting Officer

Commissioner of Patents and Trademarks